(12) United States Patent
Kawakita et al.

(10) Patent No.: US 7,028,401 B2
(45) Date of Patent: Apr. 18, 2006

(54) JUNCTION BOX AND WIRE HARNESS CONNECTION METHOD

(75) Inventors: Shinji Kawakita, Yokkaichi (JP); Yuuji Saka, Yokkaichi (JP); Noriko Kobayashi, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 360 days.

(21) Appl. No.: 10/120,423

(22) Filed: Apr. 12, 2002

(65) Prior Publication Data

US 2002/0151197 A1 Oct. 17, 2002

(30) Foreign Application Priority Data

Apr. 12, 2001 (JP) .............................. 2001-114518

(51) Int. Cl.
*H01R 43/02* (2006.01)
(52) U.S. Cl. .............................. 29/860; 29/857; 29/842; 29/843; 29/829; 174/72 R; 174/72 A; 174/72 C
(58) Field of Classification Search .................. 29/825, 29/857, 860, 842, 843, 829; 174/70 C, 72 R, 174/72 A, 72 C
See application file for complete search history.

(56) References Cited

U.S. PATENT DOCUMENTS

| 4,343,085 A | * | 8/1982 | Lucius et al. .................. 29/866 |
| 4,794,373 A | * | 12/1988 | Harrison ................ 340/286.01 |
| 4,824,164 A | * | 4/1989 | Nakayama et al. ...... 296/146.7 |
| 5,501,605 A | * | 3/1996 | Ozaki et al. .................. 439/34 |
| 5,507,668 A | * | 4/1996 | Lambrinos et al. ......... 439/502 |
| 6,019,271 A | * | 2/2000 | Hayden et al. .......... 228/110.1 |

* cited by examiner

*Primary Examiner*—Richard Chang
(74) *Attorney, Agent, or Firm*—Greenblum & Bernstein, P.L.C.

(57) ABSTRACT

A method is provided of connecting wires of a wiring harness to a junction box to form branch circuits. An electrical conductor material is formed in parallel strips in a Y-axis direction on one surface of an insulator board, and wires are arranged in an X-axis direction on the other side of the insulator board. A circuit assembly is formed by connecting the exposed cores of one end of the wires to the conductor material through openings provided in the insulator board. Connector terminals are installed at the other end of the wires that extend outward and away from the insulator board. Groups of wires are gathered and placed in same connectors in which joint terminals are provided. The wires are joined to the connectors to form multiple wire harnesses. The aforesaid circuit assembly is then installed within an upper and lower case assembly provided with lateral openings through which the wire harness can pass.

13 Claims, 6 Drawing Sheets

PRIOR ART

JUNCTION BOX AND WIRE HARNESS CONNECTION METHOD

BACKGROUND OF THE INVENTION

1. Field of the Invention

The present invention relates to a method of connecting an automotive electrical junction box and wire harness. Specifically, the invention relates to a method whereby the wire harness wires can be connected to the internal junction box circuits with improved assembly efficiency.

2. Discussion of Background Information

The number of circuits contained in an automotive junction box has been increasing lately as a result of the large number of electrical devices that are being installed in automobiles. The high density of branch circuits connected inside the junction box results in an extremely large number of components. This necessitates a correspondingly large number of assembly operations.

Figure 6:
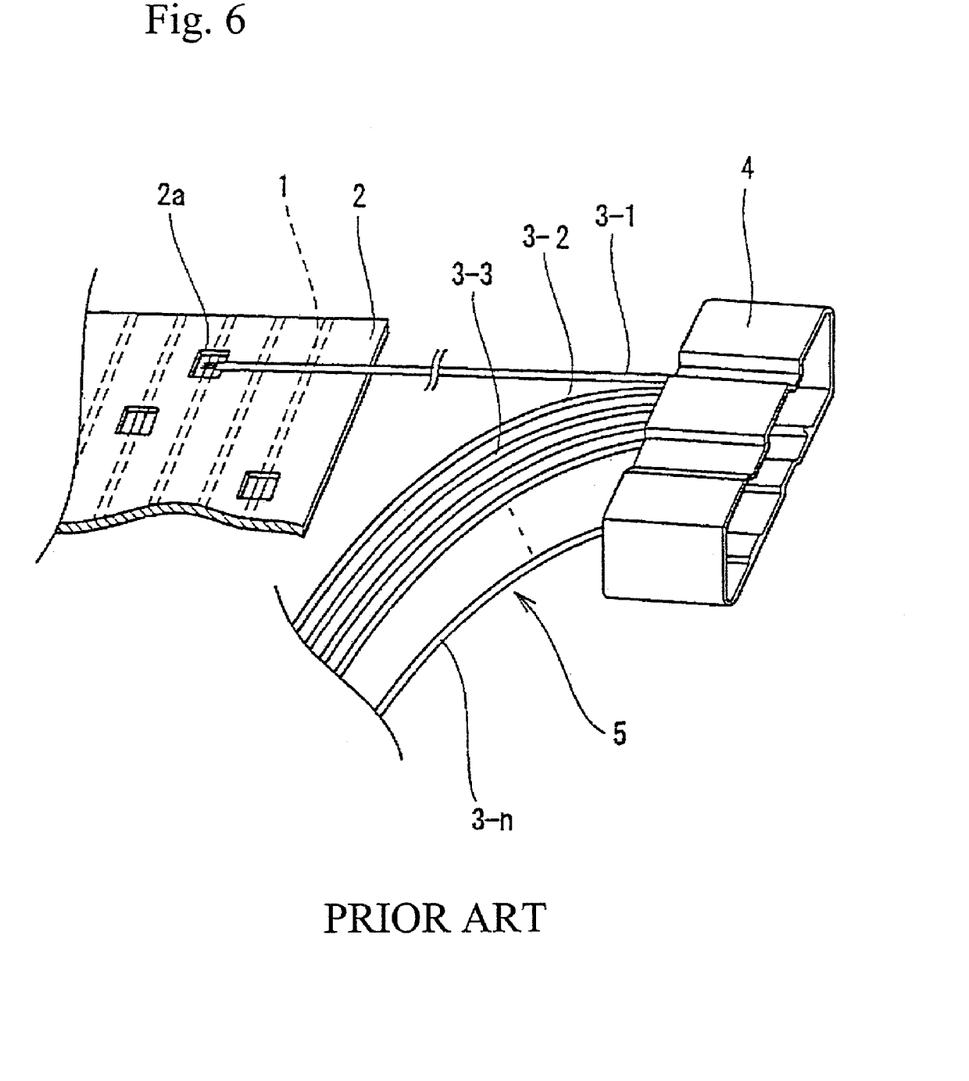
FIG. 6 shows an oblique cross sectional view of a prior art branch circuit connecting method.

FIG. 6 illustrates a structure that has been previously put forth as means of connecting branch circuits to a junction box with the purpose of reducing the thickness of the junction box, allowing the junction box to easily accommodate changes in circuitry, and reducing the number of operations required to connect branch circuits to a junction box.

The aforesaid connected branch circuits consist of wires 3-1, 3-2, 3—3, 3-$n$ etc. (3-$n$ representing any number of additional wires) that form temporarily bundled wire harness 5 to which connector 4 is attached at one end.

Wires 3-1 etc. are arranged on the top surface of insulator board 2 at their other end in a direction that crosses over trunk conductors 1 that are arranged in parallel strips on the lower surface of insulator board 2. Wires 3-1 etc. are welded to specific trunk conductors 1 through windows 2$a$ that are provided within insulator board 2.

This type of branch circuit connecting method provides means whereby the thickness of the circuit structure can be decreased, circuit assembly operations reduced, and branch circuit modifications easily executed by changing the location of the aforesaid solder windows.

The aforesaid method of connecting a wire harness to the internal circuitry of a junction box is conducted with the wire harness partitioned and temporarily bundled into many leads that extend to destination points for a specific electrical system. Connecting this type of temporarily bundled and partitioned wire harness to the circuits within the junction box largely limits the branch wire connecting structure, makes circuit design extremely difficult, complicates circuit layout, and makes the welding operation unnecessarily difficult due to the wire harness being in a finished but temporarily bundled condition at the time it is connected to the circuits in the junction box.

Furthermore, at the time when the wires of the temporarily bundled wire harness are led through the insulator board and welded to the electrically conductive material located on the opposite side of the insulator board, the efficiency of the welding operation is adversely affected because the total weight of wire harness 5 is applied to the wires being welded, a problem that results from the other ends of the aforesaid wires being attached to connectors and other wires through those connectors.

The present invention considers the aforesaid shortcomings relating to wiring structures in which electrical leads from a wire harness are directly connected to circuits within a junction box, and proposes a method by which branch circuits emanating from the junction box can be easily structured, and a method by which the amount of labor needed for the wire connection operation can be reduced.

SUMMARY OF THE INVENTION

As a way of resolving the aforesaid shortcomings, the present invention proposes a junction box and wire harness connecting method characterized by a circuit assembly that includes an insulator board to which an electrically conductive material is attached on one surface in the form of parallel conductor strips aligned on a Y-axis, crossing wires oriented on an X-axis on the opposite surface of the aforesaid insulator board, one end of the crossing wires having exposed cores and the other ends being connected to a terminal. Windows are provided in the aforesaid insulator board through which the aforesaid exposed cores of the crossing wires can be welded to the aforesaid conductor strips.

The ends of the groups of wires extending outwardly away from the aforesaid insulator board are gathered and placed within same connectors by insertion into terminals within each connector, and are joined to the connectors to form multiple wire harnesses.

The aforesaid circuit assembly is then installed within upper and lower cases, and openings are provided in the side of the case assembly as a way of allowing the aforesaid multiple wire harnesses to exit outwardly away from the junction box.

As described above, the present invention is structured as a circuit assembly installed within a junction box in which the electrical wires connected to the circuit assembly are installed individually and separately before being temporarily bundled, thus eliminating the restrictions inherent in connecting bound wires when a temporarily bundled wire harness is used. To explain further, the electrically conductive material that forms the internal circuitry of the junction box is arranged in parallel conductor strips on one surface of the insulator board, and the wires that form the aforesaid wire harness are arranged in parallel in a direction that crosses over the aforesaid conductor strips. The conductor strips and wire harness wires are thus oriented in opposing X- and Y-axis directions respectively in a manner as to allow mutual welded connecting at their intersections through window orifices formed within the insulator board.

This structure allows the technician executing the wire welding operation to support and weld individual single wires only to the circuit board. This provides for a welding operation that is significantly easier and faster compared to that in which a wire is welded to the circuit board as part of a temporarily bundled wire harness.

While the conventional wire welding process limits the placement of groups of wires going to destinations within a specific wiring system by restricting their positions to close mutual proximity, the present invention simplifies the circuit assembly structure by allowing the wires to be easily placed at their most advantageous positions.

In addition, the connecting operation for the ends of the aforesaid group of harness wires opposite to those ends welded to the aforesaid circuit board is further simplified through a structure in which those wire ends are gathered together and placed within the same connector. The wire ends need only to be inserted into the connector while their opposite ends are supported by the insulator board as a result of their welded connection to the board.

Lastly, the junction box is assembled by placing the circuit assembly, in a condition with one end of the wire harness already attached, into the junction box case, with the multiple wire harnesses protruding out of the side of the case.

Moreover, connecting wires attached to another connector may be joined to the connector to which the ends of the aforesaid group of harness wires are attached. These connecting wires may also be joined to other wires through joint terminals installed within the aforesaid other connector. This type of structure makes it possible to connect the internal junction box circuits to external wires in a wide range of configurations.

The invention also provides for a method of connecting a junction box and wire harness wherein the method includes providing an electrically conductive material in a form of strips arranged in parallel in a Y-axis direction on one surface of an insulator board, arranging groups of electrical wires aligned in a X-axis direction on another surface of the insulator board, the electrical wires being oriented so as to cross the strips and including one end having exposed cores and another end having wire terminals, connecting the exposed cores to the strips through windows provided in the insulator board to form a circuit assembly, gathering and inserting the wire terminals into a connector, whereby the wire terminals can be connected to other wires, through one or more other connectors, so as to form a multiple wire harness, and installing the circuit assembly into a case structure that includes an upper and lower case portions, whereby the multiple wire harness can extend outward and away from the case structure through orifices located on a side of the case structure.

The method may further include installing ends of connecting wires to the connector. Furthermore, the connecting wires may be joined to other connectors attached to the connectors to which the ends of groups of wires are joined, the connecting wires being connected to the wires through joint terminals located in the connectors.

The method may further include installing other ends of the connecting wires to another connector. The connecting may include one of welding and soldering. The connecting may include electrical connecting.

The invention also provides for a method of connecting a junction box and wire harness wherein the method includes providing an insulator board having electrically conductive material in a form of strips arranged in parallel in a Y-axis direction, arranging at least two wires in a X-axis direction adjacent a surface of the insulator board, the at least two wires being oriented so as to cross the strips and including a first end and a second end, connecting one of the at least two wires to one of the strips through a window provided in the insulator board, connecting another of the at least two wires to another of the strips through another window provided in the insulator board, inserting the second ends of the at least two wires into a connector, and installing the insulator board and the at least two wires into a case structure.

The method may further include allowing the at least two wires and the connector to extend from an opening in the case structure. The method may further include inserting the first ends of the at least two wires into another connector. The method may further include installing one end of a connecting wire to the connector. The method may further include installing another end of the connecting wire to another connector. The connecting may include one of welding and soldering. The connecting may include electrical connecting.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
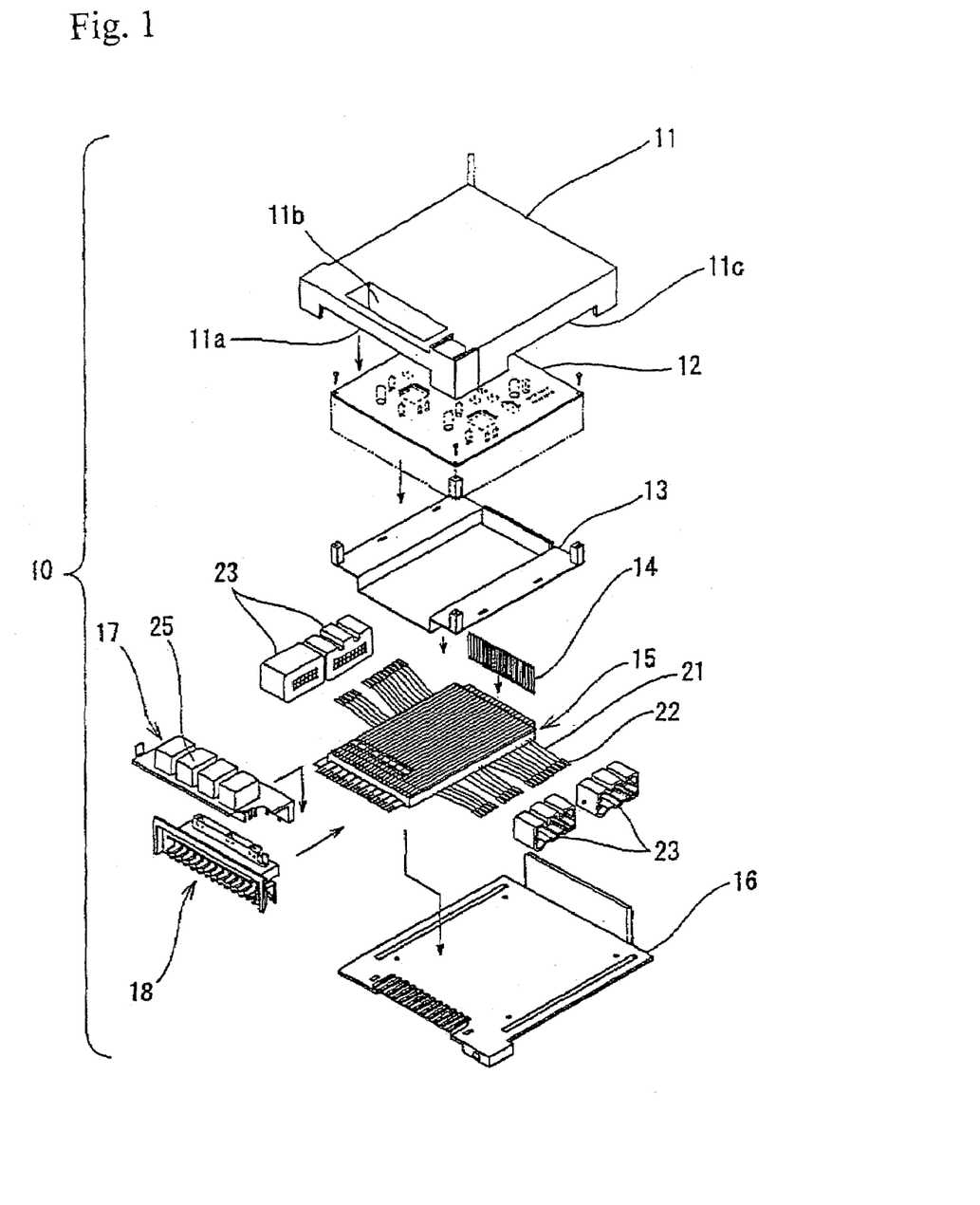
FIG. 1 shows an exploded oblique view of a junction box structured in accordance with the first embodiment of the invention.

The following will discuss a first embodiment of the invention with reference to the drawings. FIG. 1 is an oblique exploded view of the present invention in which connector module 15, relay module 17, and fuse module 18 are installed within upper case 11 and lower case 16, and in which electronic control unit 12 is installed at a distance above connector module 15 and connected to connecter module 15 through connecting terminals 14.

The aforesaid components form a structure in which connector module 15, divider case 13, and electronic control unit 12 are sequentially installed on lower case 16 and covered by upper case 11. Furthermore, relay module 17 is located at the upper end of this structure so as to allow relay 25 to be exposed through orifice or opening 11b provided on one extremity or end of upper case 11. The fuse module 18 is assembled to one extremity or end of connector module 15, and lead wires 21 pass and/or extend from both sides of connector module 15 to the external environment through harness orifices or openings 11c of upper case 11.

Figure 2A:
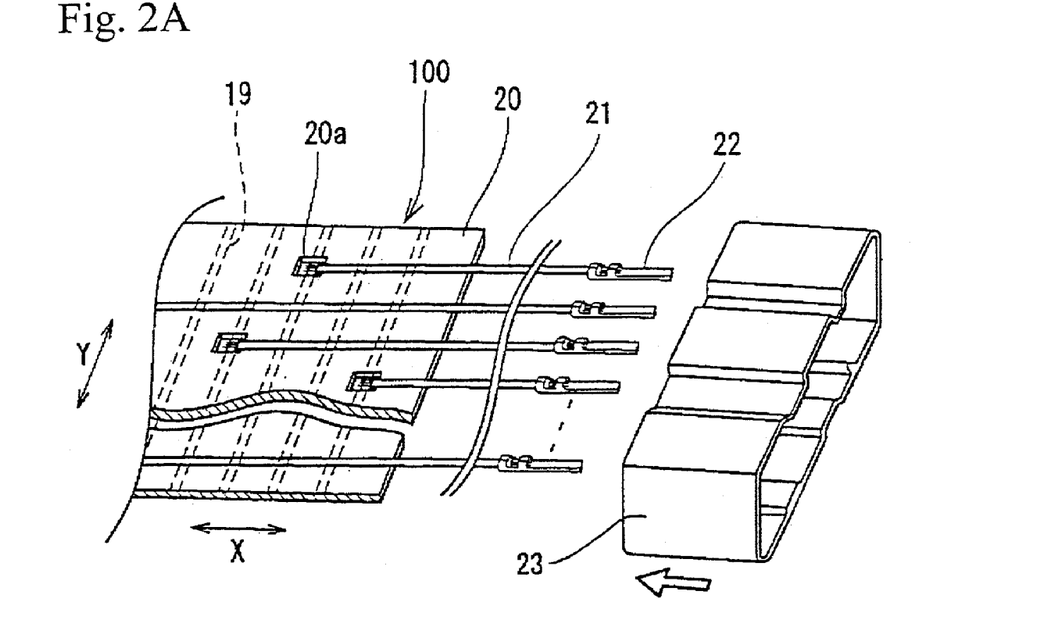
FIGS. 2A and 2B show oblique partial cross sectional views of the connector module of the first embodiment.

The following describes the structure of connector module 15. As shown in FIG. 2A, conductor strips 19 (electrically conductive material) are previously formed on one surface of insulator board 20 in a mutually aligned parallel Y-axis direction. The insulation at the ends of wires 21, i.e., the ends opposite to that at which terminals 22 are attached, have been removed to expose the cores of wires 21. The portions of wires 21 at their exposed core side are arranged in parallel alignment in an X-axis direction on the side of insulator board 20 opposite to the aforesaid conductor strips 19.

When laying out wires 21, those wires comprising parts of the harness leading to common destinations in the wiring system should be initially laid out in close mutual proximity.

Conductor strips 19 and wires 21, aligned in crossing Y- and X-axis directions on the respective top and bottom sides of insulator board 20, are electrically connected using any method, conventional or otherwise. However, it is preferred that an ultrasonic or resistance welding process be used. These connections occur at intersections at windows 20a that have been previously formed in insulator board 20 at the required locations, thus forming circuit assembly 100 that contains the desired connected branch circuits.

Figure 2B:
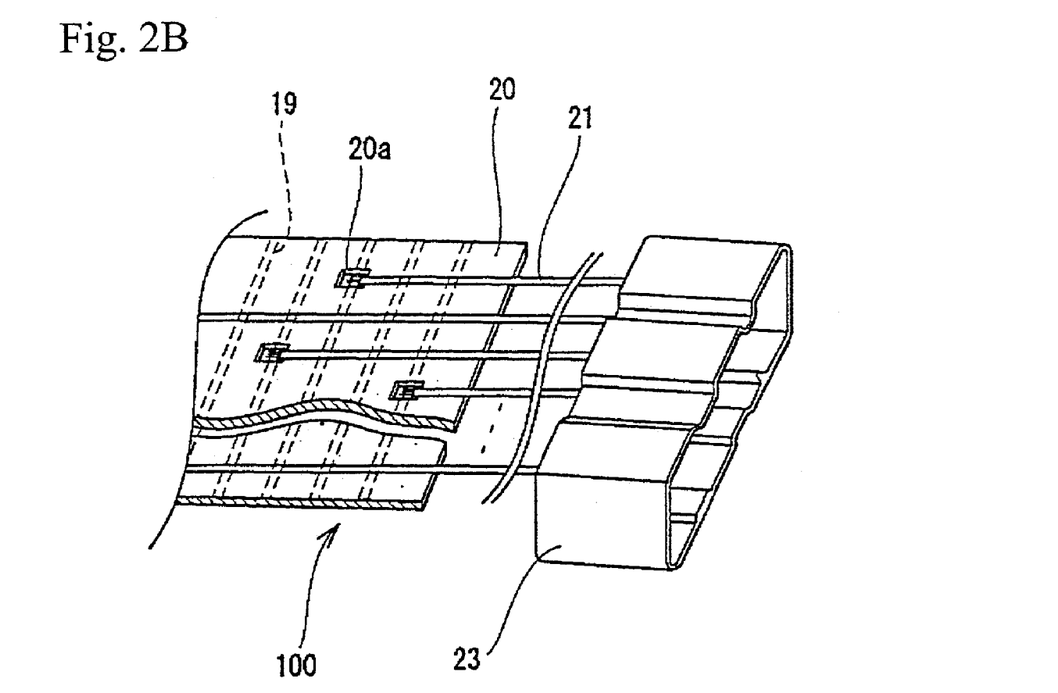

Groups of wires 21 extending outward from insulator board 20 are gathered and their terminal ends 22 inserted into connectors 23, the ends of wires 21 being extended by way of other connectors and wires to form a wire harness which is wrapped up in a bundled condition.

This structure eliminates the need to connect a temporarily bundled wire harness directly to a circuit board by allowing the branch circuits to be initially formed through a process in which separate individual wires are welded at the required intersections where conductors cross within the junction box. After it is completely assembled, circuit assembly 100 is installed within the junction box, the terminal ends of the wires are inserted into the required connector 23, and the thusly formed wire harness is bundled.

Applying the aforesaid method, it becomes possible to position wires 21, which will subsequently form a bundled wire harness, at optimum locations in relation to conductor strips 19, thus making it easy to structure circuit assembly 100. Moreover, the assembly technician, when welding conductor strips 19 and harness wires 21 together, may hold and weld one wire at a time, an operation that is significantly easier than the conventional one in which the weight of a completely assembled and bundled wire harness is applied to the wire leads being welded.

In addition, while conductive strips 19 may be ultrasonically or resistively welded, in an exposed non-insulated condition, to wires 21, they may also be ultrasonically welded to wires 21 in an insulated condition as the insulation will automatically melt, as a result of the ultrasonic vibrations generated during the welding process. If a resistance welding process is utilized, however, conductive strips 19 must be weld connected in an exposed non-insulated condition.

Moreover, while FIGS. 2A and 2B describe circuit assembly 100 as including only wires 21 and conductor strips 19 installed on opposite sides of insulator board 20 in crossing X- and Y-axis directions, the connector module may be structured in a way in which the respective conductor strips and wires are installed on both the bottom and top, or on either the top and bottom of the insulator board in X and Y, or Y and X axes or any combination thereof. The aforesaid conductor strips and wires can be mutually welded at their intersections in the same manner as explained previously, and the circuit assembly formed from the welded branch circuits provided in a plurality that forms an overlapped layered structure. This layered structure of circuit assemblies may, of course, also utilize the X-axis wires shown as wires 21 in FIGS. 2A and 2B.

Figure 3A:
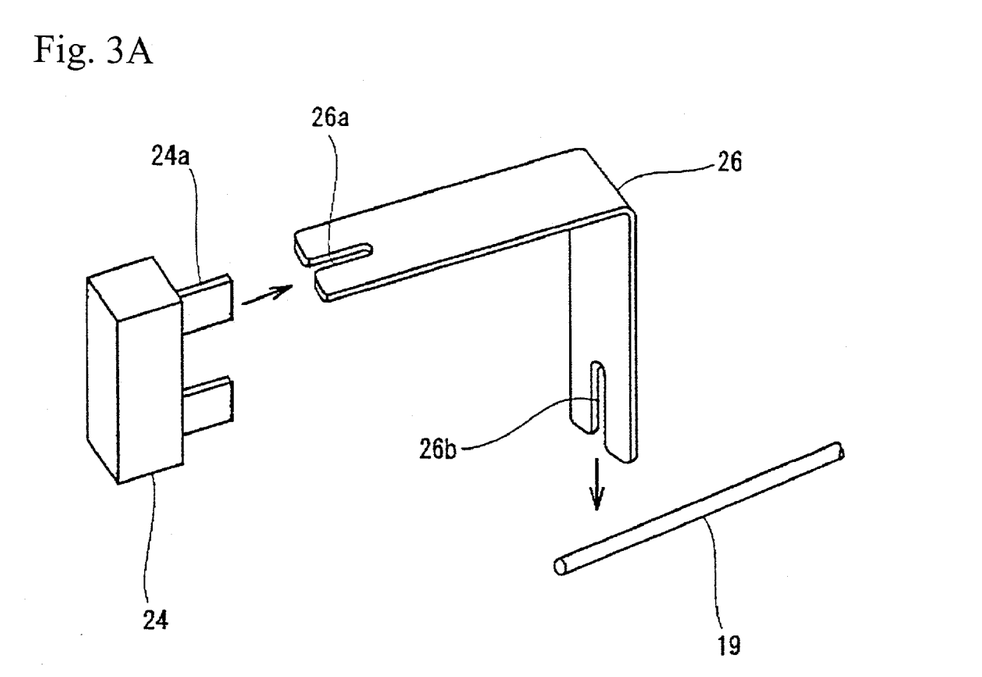
FIG. 3A shows the connector and fuse modules in a mutually joined condition.
Figure 3B:
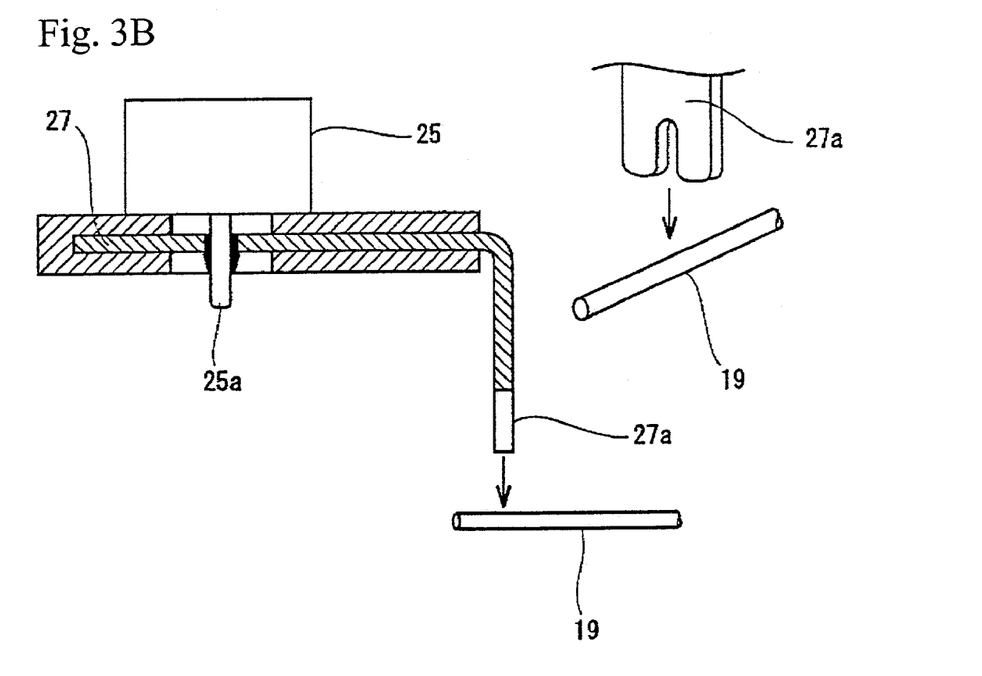
FIG. 3B shows the connector and relay modules in a mutually joined condition.

As shown in FIG. 3A, a pressure fit terminal 26b, located on the edge of bus bar 26 of fuse module 18, is frictionally inserted around wire 19 of connector module 15, and pressure fit terminal 26a, located on the other edge of bus bar 26, is frictionally connected to terminal 24a of fuse 24. Additionally, as shown in FIG. 3B, pressure fit terminal 27a, located on bus bar 27 of relay module 17, is frictionally attached to wire 19 of connector module 15, and terminal 25a of relay 25 is soldered to bus bar 27.

As junction box 10 is formed of a module-type of circuit assembly, any changes in circuit configuration can be easily executed because those changes need only be accomplished within the module they relate to, that is, only connector module 15, fuse module 18, or relay module 17 need be changed, if desired. Moreover, the thickness of junction box 10 can be kept to a minimum dimension because there are no circuits located between the modules that would necessitate a layered structure.

Furthermore, when connector module 15 is to connect to external circuits, utilizing groups of wires 21 as a way of forming the internal branch circuits allows the circuits within connector module 15 to be simply and easily modified.

Figure 4A:
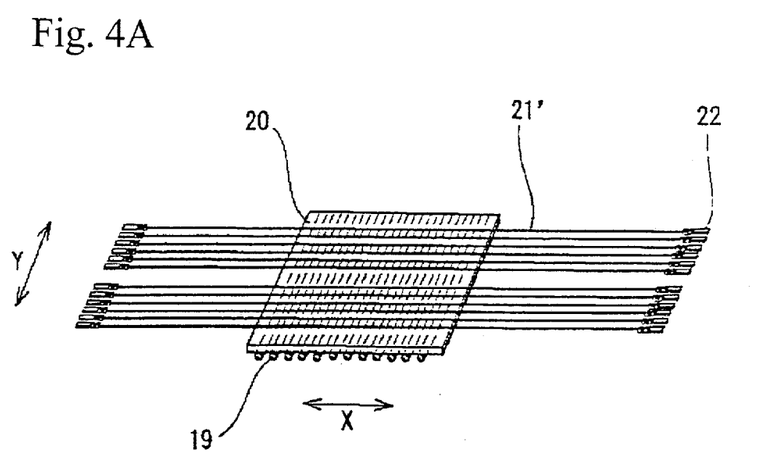
FIGS. 4A and 4C show oblique views describing the connector module structure of the second embodiment.
Figure 4B:
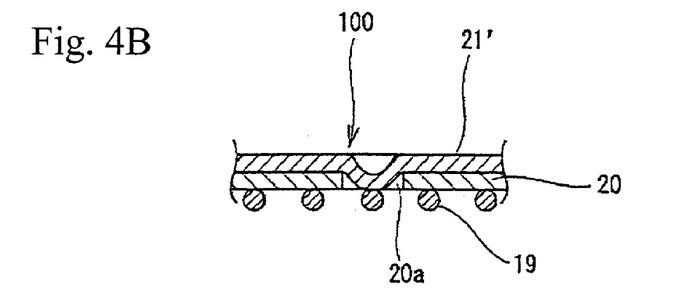
FIG. 4B shows a partial detail cross section of FIG. 4A.
Figure 4C:
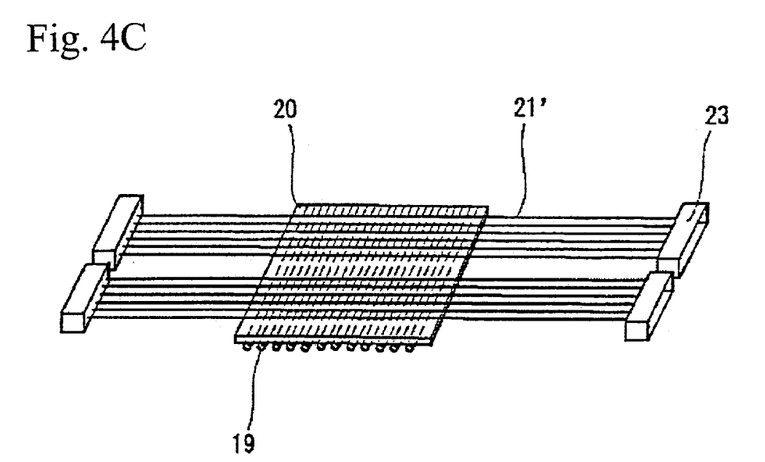

FIGS. 4A–4C describe a second embodiment of the invention. In FIG. 4A, connector module conductor strips 19 are first installed to one surface of insulator board 20 in parallel alignment in an Y-axis direction after which the central region of wires 21', to which wire terminals 22 are connected at both ends thereon, are attached to the side of insulator board 20 opposite to strips 19.

Moreover, as shown in FIG. 4B, strips 19 and wires 21' mutually cross on Y and X axes on the upper and lower sides of insulator board 20 respectively to form the required branch connector circuits through their mutual welded connections at windows 20a that have been previously formed within insulator board 20.

Subsequently, as shown in FIG. 4C, groups of wires 21' extending away from insulator board 20 are gathered together and their terminal ends 22 inserted into connectors 23. The ends of wires 21' can thus be extended through connection to other wires, through connectors, to form the wire harness.

Other characteristics of this second embodiment are similar to the first embodiment, and as such their explanation has been omitted.

Figure 5A:
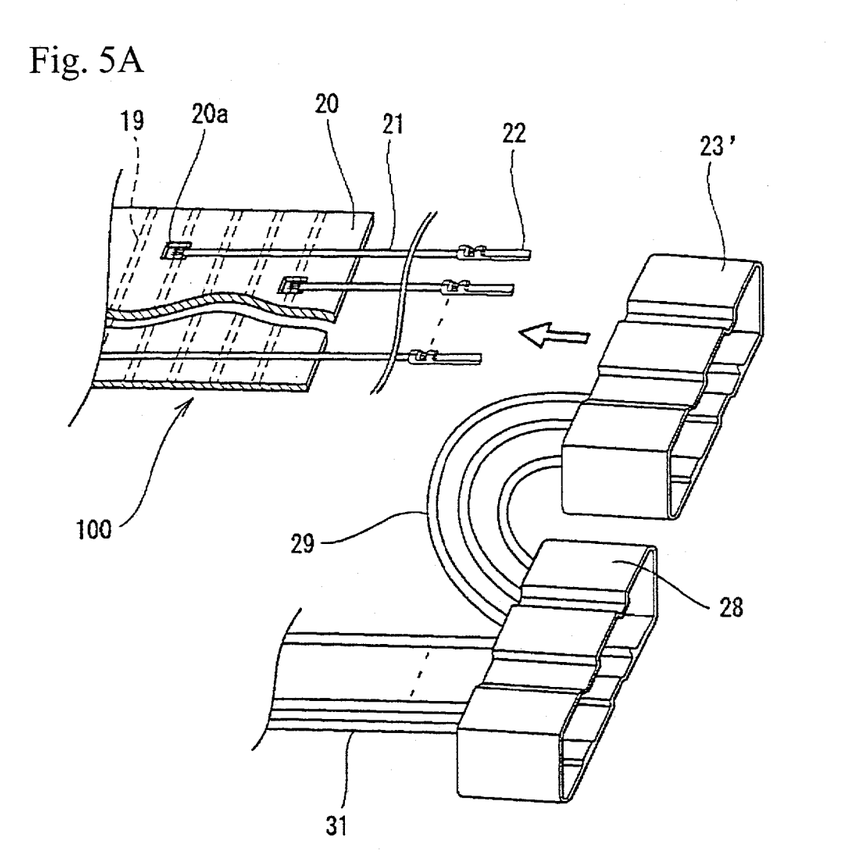
FIG. 5A shows an oblique cross section showing the method by which the third embodiment connector module is assembled.
Figure 5B:
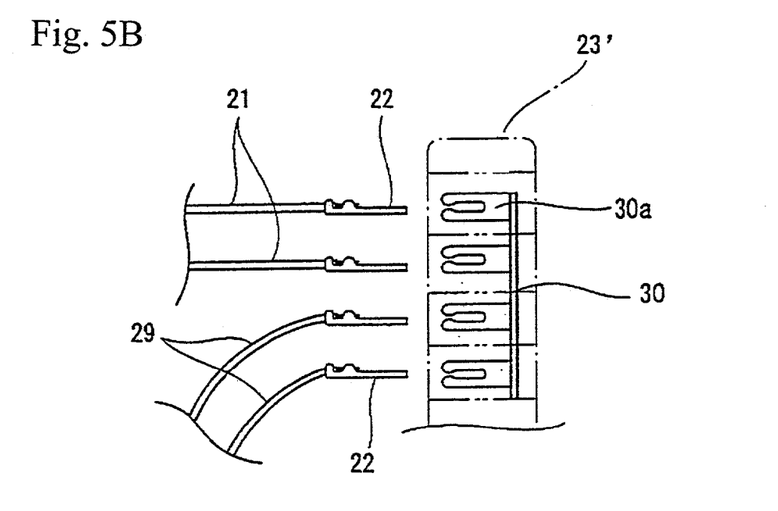
FIG. 5B shows the method of connecting the wires and connecting wires within the connector.

FIGS. 5A and 5B describe a third embodiment of the invention. As shown in FIG. 5A, terminals 22 of wires 21 and connecting wires 29 from connector 28 are both installed within connector 23'. Furthermore, wires 31 are also connected to connector 28. FIG. 5B shows the structure and illustrates how terminals 22 of wires 21 and connecting wires 29 are installed to joint terminal 30 of connector 23' through pressure insertion into multiple friction tabs 30a.

In this third embodiment, the method of assembling the connector module is otherwise the same as that explained for the first embodiment. Wires 21 are arranged in parallel alignment on one surface of insulator board 20 and pass through windows 20a where they are welded to conductor strips 19 located on the opposite side of the board 20. Groups of wires 21 extending away from insulator board 20 are gathered together and their terminal ends 22 and inserted into connectors 23, and the ends of wires 21 can be extended through connection to other wires, through connectors, to form the wire harness.

This type of structure reduces the amount of labor for the assembly technician by allowing wires to be supported and welded separately and individually. This can be true even in cases where the number of devices joined to connector increase in number, as a result of connector 23', connecting wires 29, and other connectors 28 and wires 31 being separate components that do not interfere with the welding operation.

The invention provides for a labor-saving method of connecting branch circuits to a junction box by way of a process through which the junction box circuit assembly is constructed, electrical wires are extended away from said circuit assembly, and a wire harness is formed by way of connecting the terminal ends of those electrical wires before the wire harness is bundled. Moreover, at the time when the aforesaid electrical wires and conductor strips of the internal circuit are weld connected, the assembly technician is able to hold and connect each electrical wire separately and individually without the weight of the other electrical wires being applied to the wire being welded, thus establishing a process that reduces the amount of labor devoted to the assembly process.

Moreover, in cases where connecting wires are utilized to join another connector to the connector to which the ends of the aforesaid group of wires are attached, while the weight of the entire wire harness may be relatively heavy, it places no additional burden on the assembly technician as the aforesaid connectors and connecting wires remain separated components that still allow the assembly technician to hold and weld each wire separately and individually.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present application claims priority under 35 U.S.C. 119 of Japanese Patent Application No. 2001-114518 filed on Apr. 12, 2001, the disclosure of which is expressly incorporated by reference herein in its entirely.

What is claimed:

1. A method of connecting a junction box and wire harness comprising:
   providing an electrically conductive material in a form of strips arranged in parallel in a Y-axis direction on one surface of an insulator board;
   stripping insulation from one end of each of a plurality of electrical wires such that each wire includes a first end having an exposed core and a second end having a terminal;
   arranging groups of electrical wires aligned in a X-axis direction on another surface of the insulator board, the electrical wires being oriented so as to cross the strips;
   connecting the exposed cores to the strips through windows provided in the insulator board to form a circuit assembly by individually and separately welding the exposed core of each wire to a respective strip such that the wires are fixedly attached to the circuit assembly by the welded exposed cores and the terminals of the wires are flexibly unattached;
   gathering the wires to be connected to same connectors and inserting the terminals of the wires into the connectors so as to form multiple wire harnesses after the exposed cores are connected to the strips; and
   installing the circuit assembly into a case structure that comprises upper and lower case portions and orifices located on sides of the case structure,
   whereby the multiple wire harnesses and the connectors connected thereto extend outward and away from the case structure through the orifices located on the sides of the case structure.

2. The method of claim 1, further comprising installing ends of connecting wires to the connector.

3. The method of claim 2, further comprising installing other ends of the connecting wires to another connector.

4. The method of claim 1, wherein the connecting comprises one of welding and soldering.

5. The method of claim 1, wherein the connecting comprises electrical connecting.

6. The method of claim 2, wherein the connecting wires are joined to other connectors attached to the connectors to which the ends of said groups of wires are joined, said connecting wires being connected to the wires through joint terminals located in the connectors.

7. A method of connecting a junction box and wire harness comprising:
   providing an insulator board having electrically conductive material in a form of strips arranged in parallel in a Y-axis direction;
   stripping insulation from one end of each of a plurality of electrical wires such that each wire includes a first end having an exposed core and a second end having a terminal;
   arranging at least two wires in an X-axis direction adjacent a surface of the insulator board, the at least two wires being oriented so as to cross the strips;
   connecting the exposed core of one of the at least two wires to one of the strips through a window provided in the insulator board;
   connecting the exposed core of another of the at least two wires to another of the strips through another window provided in the insulator board;
   gathering the wires and inserting the terminals on the second ends of the at least two wires into a connector so as to form multiple wire harnesses after the exposed cores are connected to the strips; and
   installing the insulator board and the at least two wires into a case structure having an opening on a side thereof so that the at least two wires with connectors connected thereto extend outward and away from the case through the opening,
   wherein the connecting the exposed cores of the at least two wires includes individually and separately welding the exposed core of each wire to the respective strip such that the at least two wires are fixedly attached to the circuit assembly by the welded exposed cores and the terminals of the wires are flexibly unattached.

8. The method of claim 7, further comprising inserting the first ends of the at least two wires into another connector.

9. The method of claim 7, further comprising installing one end of a connecting wire to the connector.

10. The method of claim 9, further comprising installing another end of the connecting wire to another connector.

11. The method of claim 7, wherein the connecting comprises one of welding and soldering.

12. The method of claim 7, wherein the connecting comprises electrical connecting.

13. The method of claim 9, wherein the connecting wires are joined to other connectors attached to the connectors to which the ends of said groups of wires are joined, said connecting wires being connected to the wires through joint terminals located in the connectors.

* * * * *